United States Patent
Park et al.

(10) Patent No.: US 7,902,082 B2
(45) Date of Patent: Mar. 8, 2011

(54) METHOD OF FORMING FIELD EFFECT TRANSISTORS USING DILUTED HYDROFLUORIC ACID TO REMOVE SACRIFICIAL NITRIDE SPACERS

(75) Inventors: Sang Jine Park, Gyeonggi-do (KR); Richard O. Henry, Hopewell Junction, NY (US); Yong Siang Tan, Hopewell Junction, NY (US); O Sung Kwon, Wappingers Falls, NY (US); Oh Jung Kwon, Hopewell Junction, NY (US)

(73) Assignee: Samsung Electronics Co., Ltd. (KR)

( * ) Notice: Subject to any disclaimer, the term of this patent is extended or adjusted under 35 U.S.C. 154(b) by 306 days.

(21) Appl. No.: 11/858,535

(22) Filed: Sep. 20, 2007

(65) Prior Publication Data
US 2009/0081840 A1    Mar. 26, 2009

(51) Int. Cl.
*H01L 21/302* (2006.01)

(52) U.S. Cl. .. 438/757; 438/303; 438/745; 257/E21.626; 257/E21.64

(58) Field of Classification Search .................. 438/197, 438/745, 757, 303; 257/E21.4, 900, E21.626, 257/E21.64; 216/95, 96, 99
See application file for complete search history.

(56) References Cited

U.S. PATENT DOCUMENTS

| | | | |
|---|---|---|---|
| 5,731,617 A | 3/1998 | Suda | |
| 6,184,157 B1 | 2/2001 | Hsu et al. | |
| 6,372,589 B1 * | 4/2002 | Yu | 438/304 |
| 6,869,866 B1 | 3/2005 | Chidambarrao et al. | |
| 7,022,561 B2 | 4/2006 | Huang et al. | |
| 7,052,946 B2 | 5/2006 | Chen et al. | |
| 7,189,624 B2 | 3/2007 | Ito | |
| 7,297,584 B2 | 11/2007 | Park et al. | |
| 7,396,718 B2 | 7/2008 | Frohberg et al. | |
| 7,482,215 B2 | 1/2009 | Dyer et al. | |
| 7,534,678 B2 | 5/2009 | Lee et al. | |
| 2003/0040158 A1 | 2/2003 | Saitoh | |
| 2004/0021160 A1 | 2/2004 | Eguchi et al. | |
| 2005/0048732 A1 * | 3/2005 | Park et al. | 438/305 |
| 2005/0093078 A1 | 5/2005 | Chan et al. | |
| 2005/0098829 A1 | 5/2005 | Doris et al. | |
| 2005/0199963 A1 | 9/2005 | Aoyama | |

(Continued)

FOREIGN PATENT DOCUMENTS

JP           6-163578           6/1994

(Continued)

OTHER PUBLICATIONS

U.S. Appl. No. 11/874,118, filed Oct. 17, 2007, Kim et al.

(Continued)

*Primary Examiner* — Michael S Lebentritt
*Assistant Examiner* — Daniel Whalen
(74) *Attorney, Agent, or Firm* — Myers Bigel Sibley & Sajovec

(57) ABSTRACT

Methods of forming integrated circuit devices include forming a field effect transistor having a gate electrode, sacrificial nitride spacers on opposing sidewalls of the gate electrode and source/drain regions, which are self-aligned to the sacrificial nitride spacers, on a semiconductor substrate. The sacrificial nitride spacers are selectively removed using a diluted hydrofluoric acid solution having a nitride-to-oxide etching selectivity in excess of one. In order to increase charge carrier mobility within a channel of the field effect transistor, a stress-inducing electrically insulating layer is formed on opposing sidewalls of the gate electrode. This insulating layer is configured to induce a net tensile stress (NMOS) or compressive stress (PMOS) in the channel.

10 Claims, 14 Drawing Sheets

U.S. PATENT DOCUMENTS

| | | | |
|---|---|---|---|
| 2005/0211375 A1 | 9/2005 | Knotter et al. | |
| 2005/0218455 A1 | 10/2005 | Maeda et al. | |
| 2005/0230756 A1 | 10/2005 | Chang et al. | |
| 2006/0011586 A1* | 1/2006 | Shea | 216/95 |
| 2006/0019438 A1 | 1/2006 | Harakawa | |
| 2006/0046400 A1 | 3/2006 | Burbach et al. | |
| 2006/0094193 A1 | 5/2006 | Horstmann et al. | |
| 2006/0118879 A1 | 6/2006 | Li | |
| 2006/0205169 A1* | 9/2006 | Yoon et al. | 438/303 |
| 2007/0099360 A1 | 5/2007 | Lee et al. | |
| 2007/0252230 A1 | 11/2007 | Zhu et al. | |
| 2007/0257336 A1 | 11/2007 | Matsumoto | |
| 2008/0026523 A1 | 1/2008 | Lee et al. | |
| 2008/0050869 A1 | 2/2008 | Sudo | |
| 2008/0073713 A1* | 3/2008 | Kim et al. | 257/336 |
| 2008/0261385 A1* | 10/2008 | Jawarani et al. | 438/517 |
| 2009/0101945 A1 | 4/2009 | Yamaguchi et al. | |

FOREIGN PATENT DOCUMENTS

| | | |
|---|---|---|
| JP | 10-177938 | 6/1998 |
| JP | 2001-352055 A | 12/2001 |
| JP | 2003-60076 A | 2/2003 |
| JP | 2003-86704 A | 3/2003 |
| JP | 2003-273240 A | 9/2003 |
| JP | 2004-47608 A | 2/2004 |
| JP | 2004-128316 A | 4/2004 |
| JP | 2005-64314 A | 3/2005 |
| JP | 2006-80161 A | 3/2006 |
| JP | 2006-173432 A | 6/2006 |
| JP | 2006-237070 A | 9/2006 |
| KR | 10-1997-0018691 | 4/1997 |
| KR | 10-0183785 B1 | 12/1998 |
| KR | 1020010038794 A | 5/2001 |
| KR | 10-2001-0076522 A | 8/2001 |
| KR | 10-2002-0017845 A | 3/2002 |
| KR | 10-2002-0074551 A | 10/2002 |
| KR | 10-2003-0076354 A | 9/2003 |
| KR | 10-2004-0070794 A | 8/2004 |
| KR | 10-2004-0107477 | 12/2004 |
| KR | 10-2005-0049243 A | 5/2005 |
| KR | 1020050048126 A | 5/2005 |
| KR | 10-2006-0000912 A | 1/2006 |
| KR | 10-2006-0004595 A | 1/2006 |
| KR | 10-2006-0119773 A | 11/2006 |

OTHER PUBLICATIONS

U.S. Appl. No. 11/831,223, filed Jul. 31, 2007, Nam et al.
Korean Office Action (3 pages) corresponding to Korean Application No. 10-2006-0128876; Dated: Oct. 24, 2007.

* cited by examiner

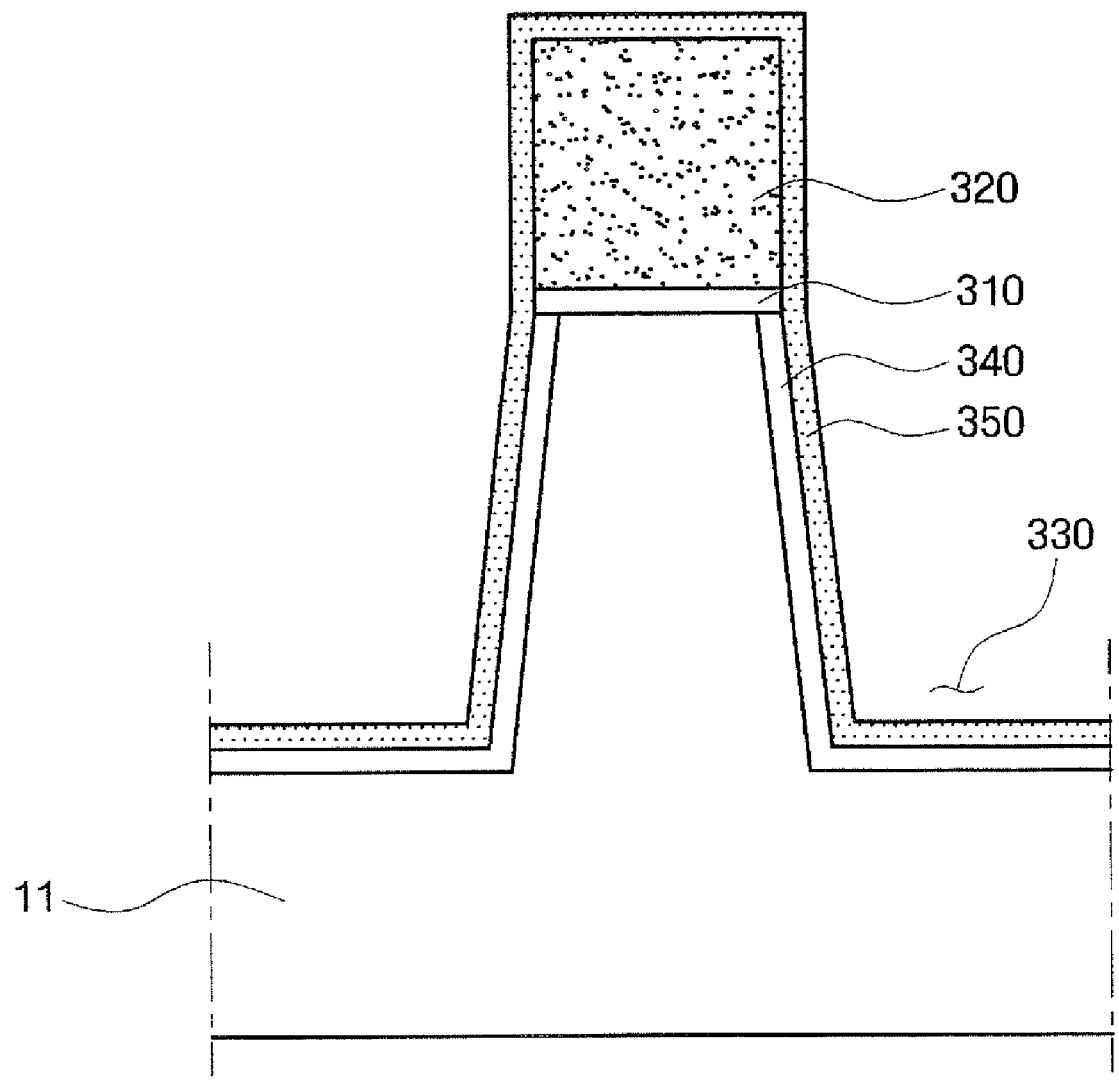

METHOD OF FORMING FIELD EFFECT TRANSISTORS USING DILUTED HYDROFLUORIC ACID TO REMOVE SACRIFICIAL NITRIDE SPACERS

FIELD OF THE INVENTION

The present invention relates to methods of fabricating integrated circuit devices and, more particularly, to methods of forming field effect transistors in integrated circuit substrates.

BACKGROUND OF THE INVENTION

Because of their physical and chemical stability, nitride films are widely used in the process of fabricating semiconductor integrated circuit devices. Nitride films typically have better mechanical strength, vapor barrier characteristics and sodium barrier characteristics than, for example, oxide films. However, it is often difficult to reliably etch nitride films.

In many cases, nitride films must be selectively removed with respect to oxide films. In a conventional etching process, a nitride film is selectively etched with respect to an oxide film using phosphoric acid ($H_3PO_4$). Specifically, a semiconductor substrate on which a nitride film and an oxide film are formed may be placed in a phosphoric acid bath, and the bath may be heated at a temperature of approximately 160 to 170° C. In this case, an etch rate of the nitride film may be approximately 40 to 45 Å/min, and that of the oxide film may be approximately 1.2 to 2.0 Å/min. That is, selectivity for nitride to oxide at a temperature of approximately 160 to 170° C. is approximately 26 to 27.

However, due to its high viscosity, phosphoric acid may have to be preheated for a lengthy duration to reliably reach the temperature of approximately 160 to 170° C. In addition, relative poor stability of phosphoric acid may require at least two dummy etching cycles before the etching process using phosphoric acid is actually performed. Etching processes using phosphoric acid may also be relatively expensive.

SUMMARY OF THE INVENTION

Methods of forming integrated circuit devices include forming a field effect transistor having a gate electrode, sacrificial nitride spacers on opposing sidewalls of the gate electrode and source/drain regions, which are self-aligned to the sacrificial nitride spacers, on a semiconductor substrate. The sacrificial nitride spacers are selectively removed using a diluted hydrofluoric acid solution having a nitride-to-oxide etching selectivity in excess of one. The sacrificial nitride spacers are replaced by a stress-inducing electrically insulating layer. In particular, a stress-inducing electrically insulating layer, which is configured to induce a net tensile or compressive stress in a channel region of the field effect transistor, is formed on the opposing sidewalls of the gate electrode.

According to some of the embodiments of the invention, the temperature of the diluted hydrofluoric acid solution is in a range between about 65° C. and about 85° C. The diluted hydrofluoric acid solution may also have a water-to-HF volume ratio in a range from about 1000:1 to about 2500:1 and, more particularly, in a range from about 1500:1 to about 2000:1.

According to further embodiments of the invention, the step of forming a stress-inducing electrically insulating layer is preceded by forming metal silicide layers on the source/drain regions. Moreover, in the event a plurality of MOS transistors of different conductivity type (e.g., CMOS circuits) are formed on the substrate, portions of the stress-inducing electrically insulating layer may be selectively removed using a diluted hydrofluoric acid solution having a nitride-to-oxide etching selectivity in excess of one. This step of removing portions of the stress-inducing electrically insulating layer is preceded by forming a blocking oxide film on the sacrificial nitride spacers and selectively etching the blocking oxide film using a diluted hydrofluoric acid solution having a nitride-to-oxide etching selectivity less than one.

According to still further embodiments of the present invention, the field effect transistor includes oxide spacers on the opposing sidewalls of the gate electrode and adhesive oxide films extending between the oxide spacers and the sacrificial nitride spacers. In these embodiments, the step of forming a stress-inducing electrically insulating layer is preceded by forming metal silicide layers that extend on the source/drain regions and contact the adhesive oxide films.

BRIEF DESCRIPTION OF THE DRAWINGS

The above and other features and advantages of the present invention will become more apparent by describing in detail preferred embodiments thereof with reference to the attached drawings in which:

FIGS. 4A through 4F are cross-sectional views of intermediate structures that illustrate methods of fabricating semiconductor integrated circuit devices according to further embodiments of the present invention.

DETAILED DESCRIPTION OF THE INVENTION

Figure 1A:
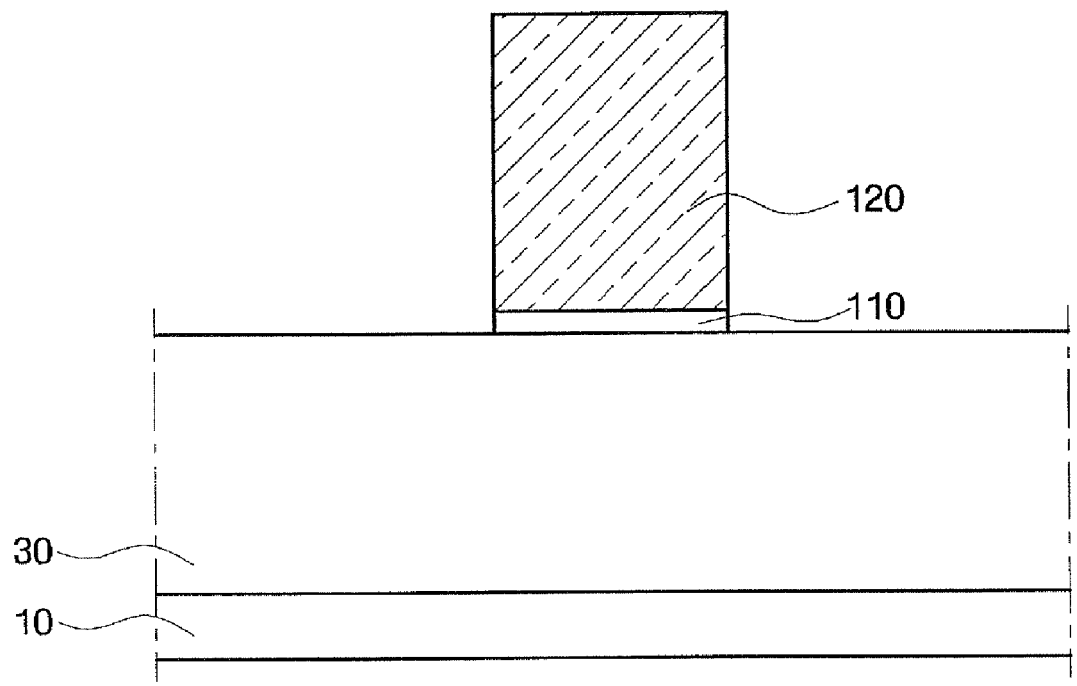
FIGS. 1A through 1H are cross-sectional views of intermediate structures that illustrate methods of fabricating semiconductor integrated circuit devices according to embodiments of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Like reference numerals in the drawings denote like elements, and thus their description will be omitted.

It will be understood that, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like reference numerals in the drawings denote like elements, and thus their description will be omitted. As used herein, the term "and/or" includes any and all combinations of one or more of the associated listed items.

It will be understood that, although the terms first, second, etc., may be used herein to describe various elements, components and/or sections, these elements, components and/or sections should not be limited by these terms. These terms are only used to distinguish one element, component or section from another region, layer or section. Thus, a first element, component or section discussed below could be termed a second element, component or section without departing from the teachings of the present invention.

The terminology used herein is for the purpose of describing particular embodiments only and is not intended to be limiting of the invention. As used herein, the singular forms are intended to include the plural forms as well, unless the context clearly indicates otherwise. It will be further understood that the terms "comprises" and/or "comprising," when used in this specification, specify the presence of stated components, steps, operations, and/or elements, but do not preclude the presence or addition of one or more other components, steps, operations, and/or elements.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense expressly so defined herein.

Spatially relative terms, such as "below," "beneath," "lower," "above," "upper," and the like, may be used herein for ease of description to describe one device or element's relationship to another device(s) or element(s) as illustrated in the drawings. It will be understood that the spatially relative terms are intended to encompass different orientations of the device in use or operation in addition to the orientation depicted in the drawings. For example, if the device in the figures is turned over, elements described as "below" or "beneath" other elements or features would then be oriented "above" the other elements or features. Thus, the exemplary term "below" or "beneath" can encompass both an orientation of above and below or beneath. The device may be otherwise oriented and the spatially relative descriptors used herein interpreted accordingly.

Table 1 shows selectivity of diluted hydrofluoric acid (dHF) at room temperature and at elevated temperatures. Referring to Table 1, LPNit indicates a nitride film formed by low-pressure chemical vapor deposition (LPCVD), and RTNit indicates a nitride film formed by room-temperature CVD. In addition, TmOx indicates an oxide film formed by thermal oxidation, and LTO indicates an oxide film formed by low-temperature CVD.

As the temperature of hydrofluoric acid is increased, selectivity for nitride to oxide increases. In addition, as the concentration of hydrofluoric acid is reduced, selectivity for nitride to oxide increases. For example, when the temperature of hydrofluoric acid diluted at 300:1 (i.e., ((volume of H20)/(volume of HF))=300) is 25° C., selectivity for LPNit to TmOx is 0.32:1. However, when the temperature of hydrofluoric acid diluted at 300:1 is 65° C., selectivity for LPNit to TmOx is increased to 0.81:1. In addition, when hydrofluoric acid at a temperature of 65° C. is diluted at 300:1, selectivity for RTNit to TmOx is 2.14:1. However, when hydrofluoric acid at a temperature of 65° C. is diluted at 1500:1, selectivity for RTNit to TmOx is increased to 41.8:1.

TABLE 1

| | LPNit:TmOx | RTNit:TmOx | LPNit:LTO | RTNit:LTO |
|---|---|---|---|---|
| 300:1 dHF at 25° C. | 0.32:1 | — | — | — |
| 300:1 dHF at 65° C. | 0.81:1 | 2.14:1 | 0.65:1 | 1.78:1 |
| 1500:1 dHF at 80° C. | 24.5:1 | 41.8:1 | 5.83:1 | 9.95:1 |

In hydrofluoric acid, reactive species used to etch a nitride film are monofluoride species (i.e., F— and HF), while reactive species used to etch an oxide film are defluoride species (i.e., HF— and $H_2F_2$). Therefore, selectivity for nitride to oxide in hydrofluoric acid is determined by which of the monofluoride species and the defluoride species occupy a greater proportion of hydrofluoric acid. That is, if the temperature of hydrofluoric acid is increased or the concentration of hydrofluoric acid is reduced, the monofluoride species occupy a greater proportion of hydrofluoric acid than the defluoride species Accordingly, the selectivity for nitride to oxide of hydrofluoric acid increases.

As the temperature of hydrofluoric acid is increased, the selectivity for nitride to oxide of hydrofluoric acid may increase. This increase in selectivity can be achieved when a temperature range is properly adjusted according to processing conditions. In Table 1, hydrofluoric acid is at a temperature of 65 or 80° C. However, the temperature of hydrofluoric acid can be adjusted, for example, between approximately 65° C. and lower than approximately 85° C.

As the concentration of hydrofluoric acid is reduced, selectivity for nitride to oxide of hydrofluoric acid may increase. This increase in selectivity can be achieved when a concentration range is properly adjusted according to processing conditions. In Table 1, the concentration of hydrofluoric acid is 300:1 or 1500:1. However, hydrofluoric acid can be diluted at approximately 1000:1 to 2500:1, more specifically, at approximately 1500:1 to 2000:1, in order to sufficiently increase the selectivity for nitride to oxide.

As shown in Table 1, the selectivity for nitride to oxide of hydrofluoric acid can be adjusted to be similar to that of phosphoric acid (approximately 26:1 to 27:1). In addition, hydrofluoric acid is far more stable and less expensive than phosphoric acid. Since the temperature of hydrofluoric acid can be increased rapidly, no additional preparation time is required. Furthermore, in an etching process in which similar selectivity for nitride to oxide is required, an etching process using hydrofluoric acid is performed at a relatively lower temperature (approximately 65° C. or higher and lower than 85° C.) than an etching process using phosphoric acid (approximately 160 to 170° C.). Hereinafter, when selectivity for nitride to oxide is, for example, 24.5:1, it will be written as "selectivity for nitride to oxide is 24.5."

FIGS. 1A through 1H are cross-sectional views for explaining a method of fabricating a semiconductor integrated circuit device according to a first embodiment of the present invention. In the present embodiment, a case where an n-channel metal oxide semiconductor (NMOS) transistor is fabricated is described as an example. However, the present invention is not limited thereto. That is, the present invention can also be applied to a method of fabricating a p-channel metal oxide semiconductor (PMOS) transistor.

Referring to FIG. 1A, a device isolation region (not shown) is formed on a semiconductor substrate 10, thereby defining an active region, and a gate insulation film 110 and a gate 120 are sequentially formed on the active region. Then, a P well 30 is formed by implanting P-type impurities into the active region.

Specifically, the semiconductor substrate 10 may be a silicon substrate, a silicon on insulator (SOI) substrate, a gallium arsenide substrate, a silicon germanium substrate, a ceramic substrate, a quartz substrate or a display glass substrate, for example. The device isolation region (not shown) may be a shallow trench isolation (STI) or a field oxide (FOX) region formed by local oxidation of silicon (LOCOS). In addition, the gate insulation film 110 may be formed of $SiO_2$, SiON, $Si_3N_4$, $Ge_xO_yN_z$, $Ge_xSi_yO_z$, high-k dielectric material, or a film formed of a stack of the same. The high-k dielectric material may be $HfO_2$, $ZrO_2$, $Al_2O_3$, $Ta_2O_5$, hafnium silicate, or zirconium silicate. In addition, the gate 120 may be polysilicon which is ion-implanted with impurities.

Figure 1B:
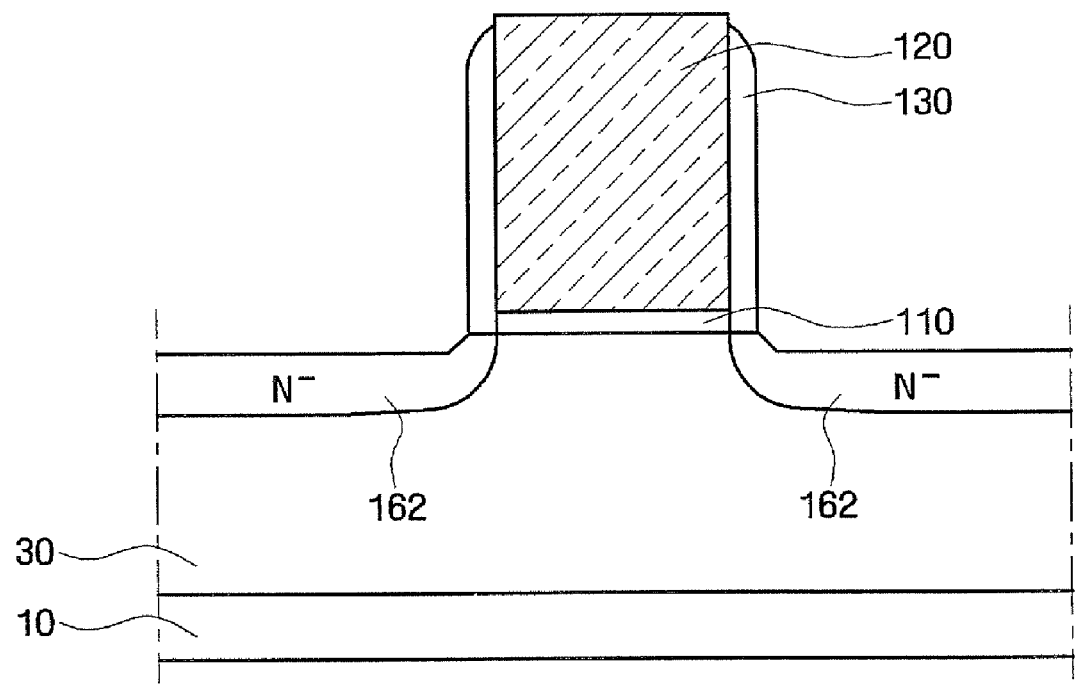

Referring to FIG. 1B, a spacer oxide film 130 is formed on sidewalls of the gate 120. Specifically, an oxide film is formed on a front surface of the semiconductor substrate 10 on which the gate 120 is formed. Then, the spacer oxide film 130 is formed on the sidewalls of the gate 120 using an etching process, such as an etch-back process, to partially remove the oxide film.

Next, a first impurity region 162, which is self-aligned with the spacer oxide film 130, is formed. Specifically, N-type impurities, such as arsenic (As), may be implanted into the active region using the spacer oxide film 130 as an ion implantation mask. At this time, halo ions may selectively be implanted into the active region. Halo ions are implanted after the gate 120 is formed in order to increase the concentration of the active region of the semiconductor substrate 10 and thus prevent a punch-through effect due to the reducing length of a channel region. Ions of an opposite conductivity type to that of ions implanted to form a source/drain region are usually used as halo ions. Therefore, P-type impurities, such as boron (B), may be implanted into the active region. Thereafter, a thermal process is performed to drive-in the implanted dopants. Rapid thermal annealing (RTA) or laser annealing (LSA) may be used in the thermal process.

Figure 1C:
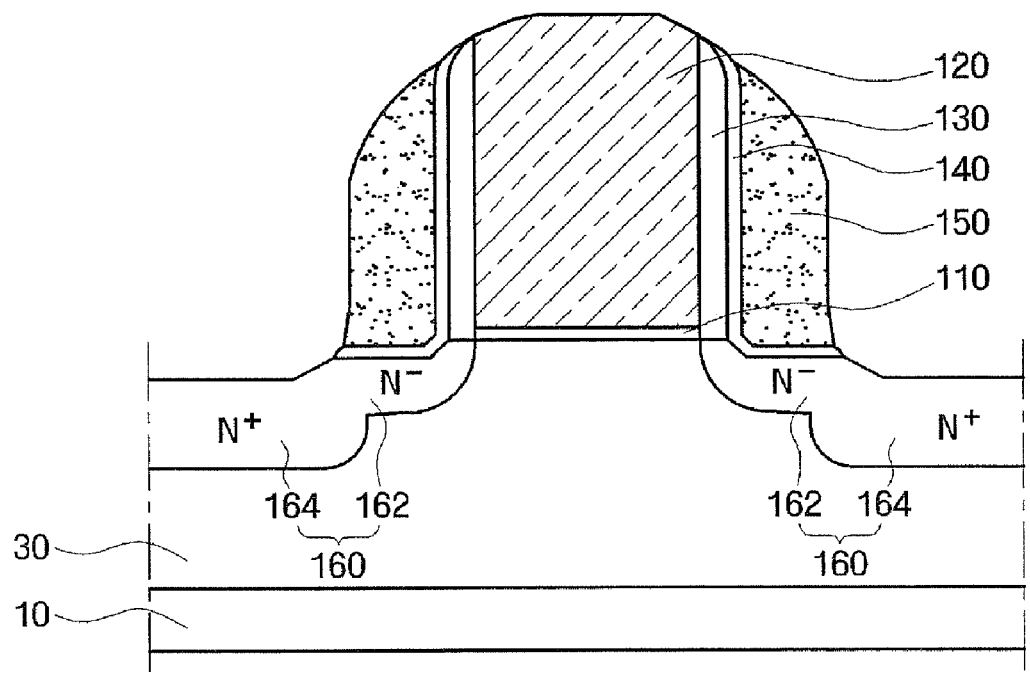

Referring to FIG. 1C, a spacer nitride film 150 is formed on the spacer oxide film 130, and an adhesive oxide film 140 is formed between the semiconductor substrate 10 and the spacer nitride film 150 and between the spacer oxide film 130 and the spacer nitride film 150. Specifically, an oxide film and a nitride film are formed on the front surface of the semiconductor substrate 10 on which the gate 120 and the spacer oxide film 130 are formed. Then, the spacer nitride film 150 and the adhesive oxide film 140 are defined using the etching process such as the etch-back process. Since the spacer nitride film 150 does not easily adhere to the gate 120 and the semiconductor substrate 10, the adhesive oxide film 140 is formed between the semiconductor substrate 10 and the spacer nitride film 150 and between the spacer oxide film 130 and the spacer nitride film 150. Furthermore, the adhesive oxide film 140 can minimize stress imposed on the gate 120 and the semiconductor substrate 10 by the spacer nitride film 150. That is, the adhesive oxide film 140 may also serve as a stress buffer. The adhesive oxide film 140 may be, for example, a Low Temperature Oxide (LTO). However, the present invention is not limited thereto.

Next, a second impurity region 164 aligned with the spacer nitride film 150 is formed. Specifically, N-type impurities, such as arsenic (As), may be implanted into the active region using the spacer nitride film 150 as an ion implantation mask. The second impurity region 164 may have a higher doping concentration than the first impurity region 162 and may be formed deeper than a region where the second impurity region 162 is formed. That is, the first and second impurity regions 162 and 164 form source/drain regions 160 having a lightly diffused drain (LDD) structure. Although not shown in the drawings, the source/drain region 160 of the NMOS transistor can have various structures such as double diffused drain (DDD), mask islanded double diffused drain (MIDDD), mask LDD (MLDD), and lateral double-diffused MOS (LDMOS) structures. Next, a thermal process is performed using RTA or LSA, to drive in the implanted dopants.

Figure 1D:
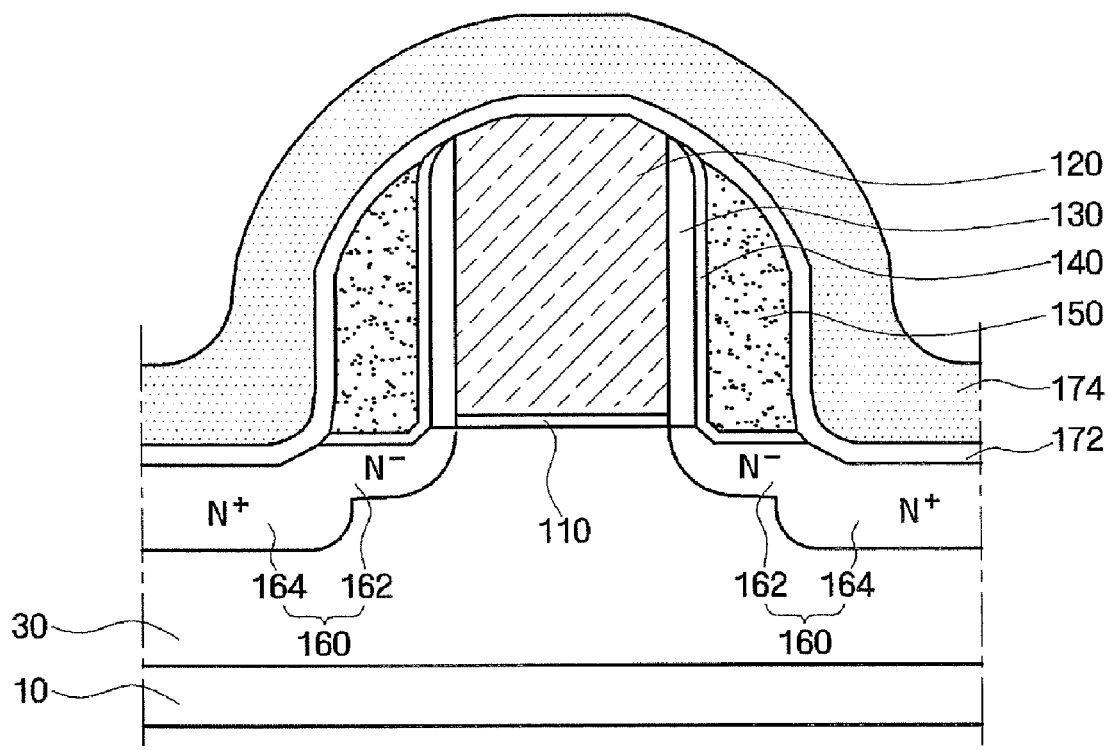

Referring to FIG. 1D, a blocking oxide film 172 and a blocking nitride film 174 are sequentially formed on the NMOS transistor. Specifically, a silicide film is to be formed in a subsequent process, and the blocking oxide film 172 and the blocking nitride film 174 are formed to block a portion of the semiconductor substrate 10 where the silicide film is not to be formed. The portion of the semiconductor substrate 10 where the silicide film is not to be formed may be, for example, a MOS transistor, which does not require high-speed operation.

Figure 1E:
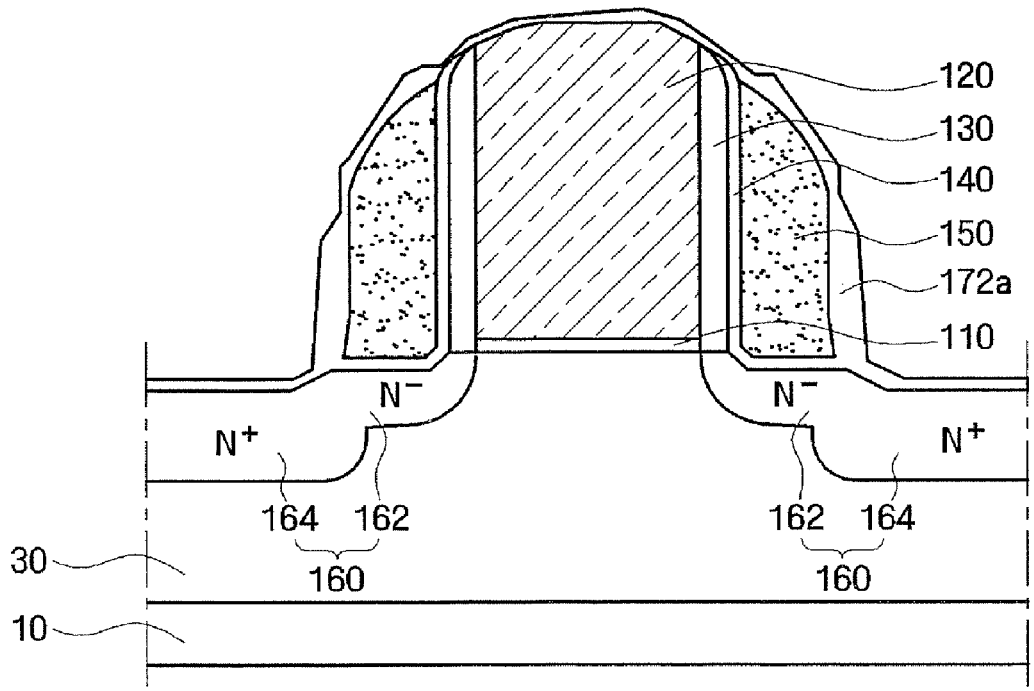

Referring to FIG. 1E, the blocking nitride film 174 formed on the NMOS transistor is etched. That is, since the silicide film is to be formed on the NMOS transistor illustrated in FIG. 1E in the subsequent process, the blocking nitride film 174 is removed from the NMOS transistor. In some embodiments of the invention, the blocking nitride film 174 may be removed using hydrofluoric acid in which selectivity for nitride to oxide exceeds one. As described above, as the temperature of hydrofluoric acid is increased or the concentration of hydrofluoric acid is decreased, the selectivity for nitride to oxide increases. Hydrofluoric acid used here may be at a temperature of approximately 65° C. or higher and lower than approximately 85° C. and may be diluted at approximately 1000:1 to 2500:1, more specifically, at approximately 1500:1 to 2000:1. In this case, the blocking oxide film 172 serves as an etch-stopping film. Therefore, not all of the blocking oxide film 172 is removed by hydrofluoric acid in which selectivity for nitride to oxide exceeds one. Instead, part of the blocking oxide film 172 remains as a remaining oxide film 172a on the semiconductor substrate 10, the spacer nitride film 150, and/or the gate 120.

Figure 1F:
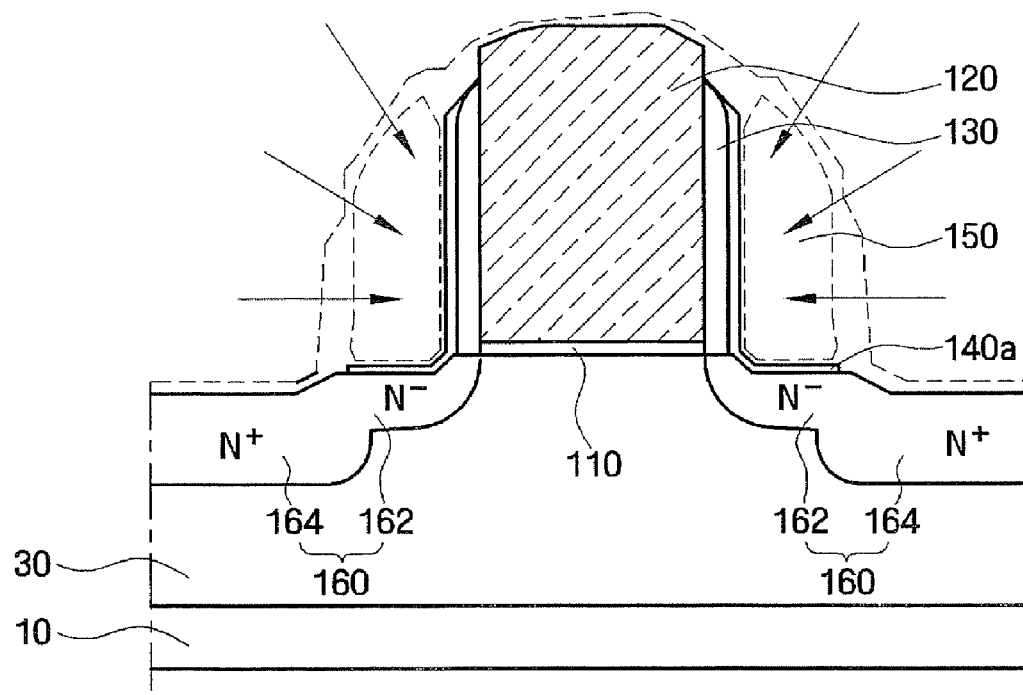

Referring to FIG. 1F, the spacer nitride film 150 of the NMOS transistor is removed. In particular, the spacer nitride film 150 may be removed using hydrofluoric acid in which selectivity for nitride to oxide exceeds one. Alternatively, the spacer nitride film 150 may be exposed by removing the remaining oxide film 172a using hydrofluoric acid in which selectivity for nitride to oxide is less than one. Then, the spacer nitride film 150 may be removed using hydrofluoric acid in which selectivity for nitride to oxide exceeds one.

Furthermore, part of the adhesive oxide film 140a may further be removed using hydrofluoric acid in which selectivity for nitride to oxide is less than one.

As described above, as the temperature of hydrofluoric acid is increased or the concentration of hydrofluoric acid is decreased, the selectivity for nitride to oxide increases. For example, hydrofluoric acid, in which selectivity for nitride to oxide exceeds one, may be at a temperature of approximately 65° C. or higher and lower than approximately 85° C. and may be diluted at approximately 1000:1 to 2500:1, more specifically, at approximately 1500:1 to 2000:1. Hydrofluoric acid in which selectivity for nitride to oxide is less than one may be, for example, at room temperature and may be less diluted than hydrofluoric acid in which selectivity for nitride to oxide exceeds one.

In the first embodiment of the present invention, the spacer nitride film 150 of the NMOS transistor is removed for the following reasons. In a subsequent process, a stress film (a tensile stress film on the NMOS transistor and a compressive stress film on the PMOS transistor) is to be formed (see FIG. 1H). If the spacer nitride film 150 is removed, since the distance between the stress film and a channel of the NMOS transistor is reduced, stress can be more efficiently transferred to the channel of the NMOS transistor.

Figure 1G:
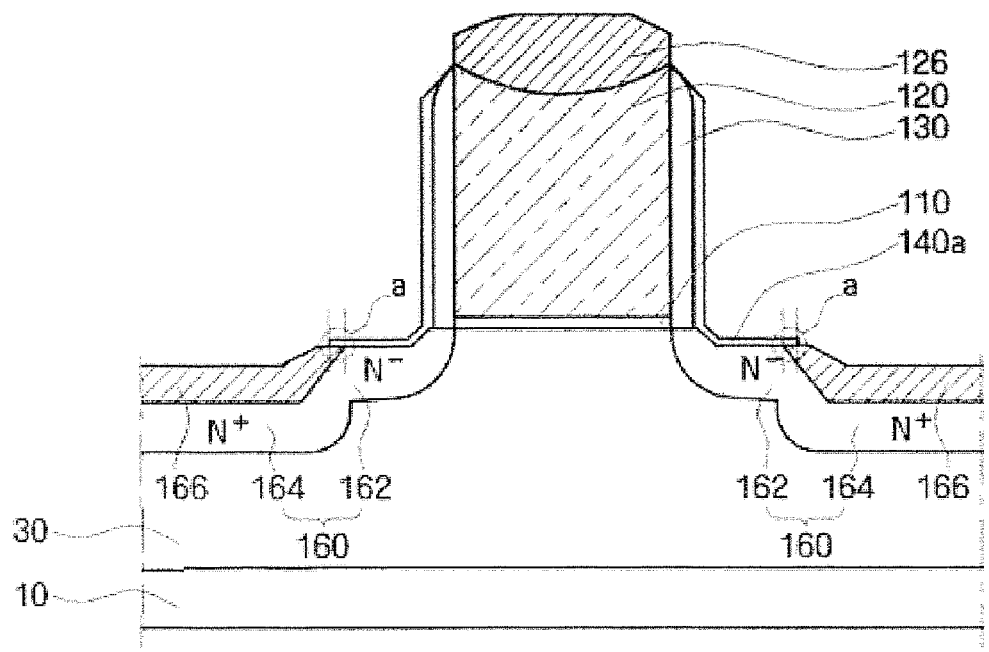

However, when the spacer nitride film 150 is removed, not all of the adhesive oxide film 140*a* formed on the semiconductor substrate 10 must be removed because the silicide film is to be formed in the subsequent process (see FIG. 1G). If the adhesive oxide film 140*a* does not exist on the semiconductor substrate 10 when the silicide film may be formed, the silicide film is formed too close to the gate 120. In this case, the probability of generating leakage current increases. Therefore, while the spacer nitride film 150 is removed, the adhesive oxide film 140*a* should at least partially remain on the semiconductor substrate 10.

Referring to FIG. 1G, a silicide film 126 and/or 166 is formed in the second impurity region and/or the gate 120. Specifically, a metal film, such as NiPt or NiPt/TiN, is formed on the NMOS transistor after the spacer nitride film 150 has been removed. Thereafter, the thermal process such as RTA or LSA is performed, thereby converting portions of the metal film to silicide films 126 and/or 166. Then, the remaining portions of the metal film are removed. The thermal process may selectively be performed again. As illustrated by the highlighted regions "a" of FIG. 1G, the silicide film 166 may partially overlap the adhesive oxide film 140.

Figure 1H:
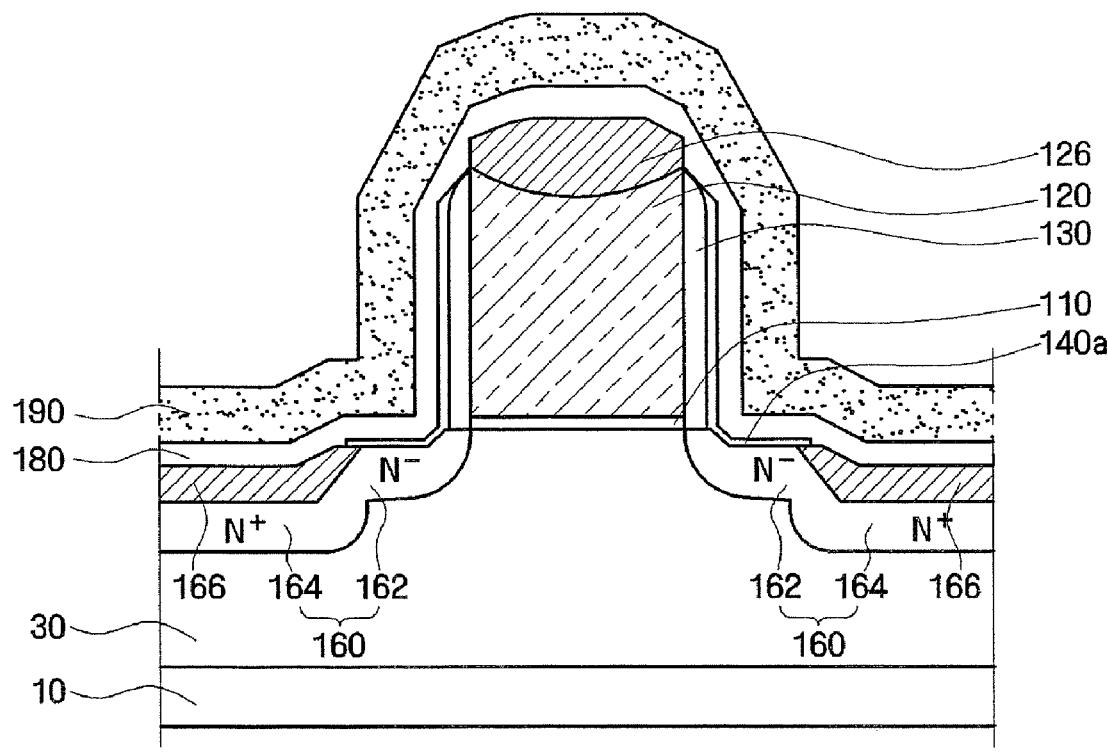

Referring to FIG. 1H, an etch-stopping film 180 and a stress film 190 are sequentially formed on the NMOS transistor. Specifically, the etch-stopping film 180 may be an oxide film such as an LTO, and the stress film 190 may be a nitride film. When the stress film 190 is a nitride film, an N—H/Si—H bonding ratio determines whether the stress film 190 applies tensile stress or compressive stress. That is, if the N—H/Si—H bonding ratio is approximately 1 to 5, the stress film 190 applies tensile stress. If the N—H/Si—H bonding ratio is approximately 5 to 20, the stress film 190 applies compressive stress. The stress film 190 having tensile stress enhances operating characteristics of the NMOS transistor, and the stress film 190 having compressive stress enhances operating characteristics of the PMOS transistor. Therefore, a stress film having tensile stress may be formed on the NMOS transistor according to the present invention.

As described above, in the first embodiment of the present invention, a gate is formed on a semiconductor substrate (see FIG. 1A), and a spacer oxide film is formed on sidewalls of the gate and a first impurity region aligned with the spacer oxide film is formed (see FIG. 1B). Then, a spacer nitride film is formed on the spacer oxide film, an adhesive oxide film is formed between the semiconductor substrate and the spacer nitride film and between the spacer oxide film and the spacer nitride film, and a second impurity region aligned with the spacer nitride film is formed (see FIG. 1C). Next, at least part of the spacer nitride film is wet-etched using hydrofluoric acid in which selectivity for nitride to oxide exceeds one (see FIG. 1F). A silicide film is formed in the second impurity region (see FIG. 1G), and an etch-stopping film and a stress film are sequentially formed on the semiconductor substrate (see FIG. 1H). However, the present invention is not limited to the above embodiment.

Figure 2A:
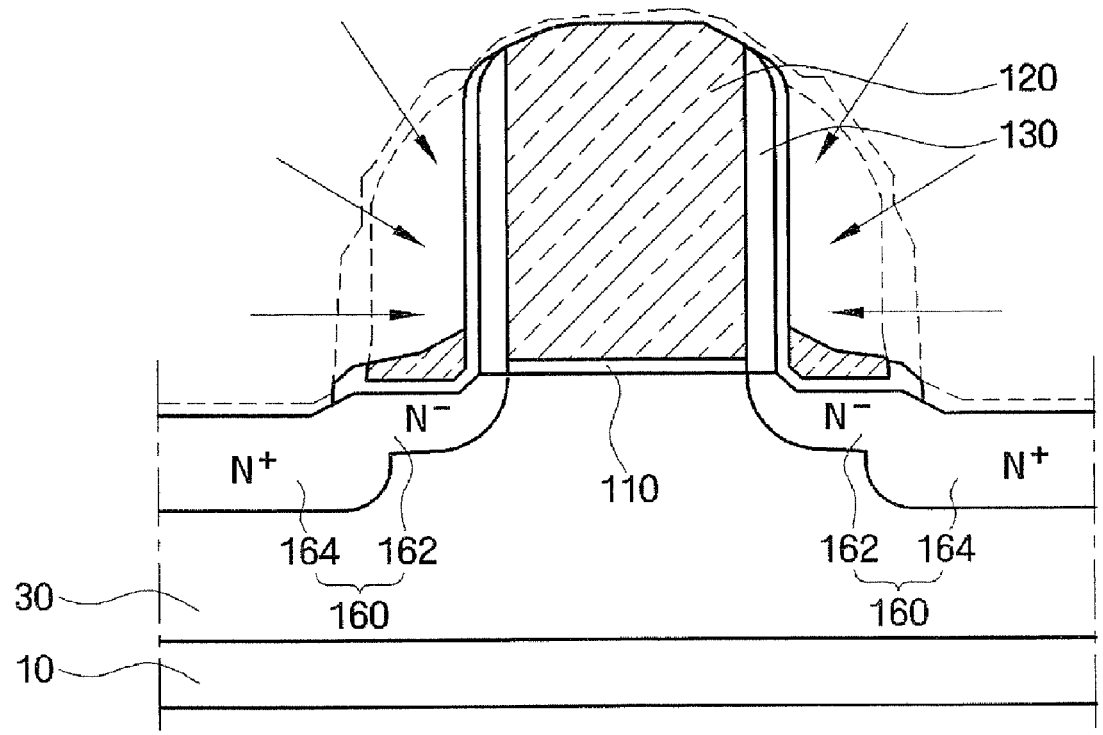
FIGS. 2A through 2C are cross-sectional views of intermediate structures that illustrate methods of fabricating semiconductor integrated circuit devices according to alternative embodiments of the present invention.
Figure 2B:
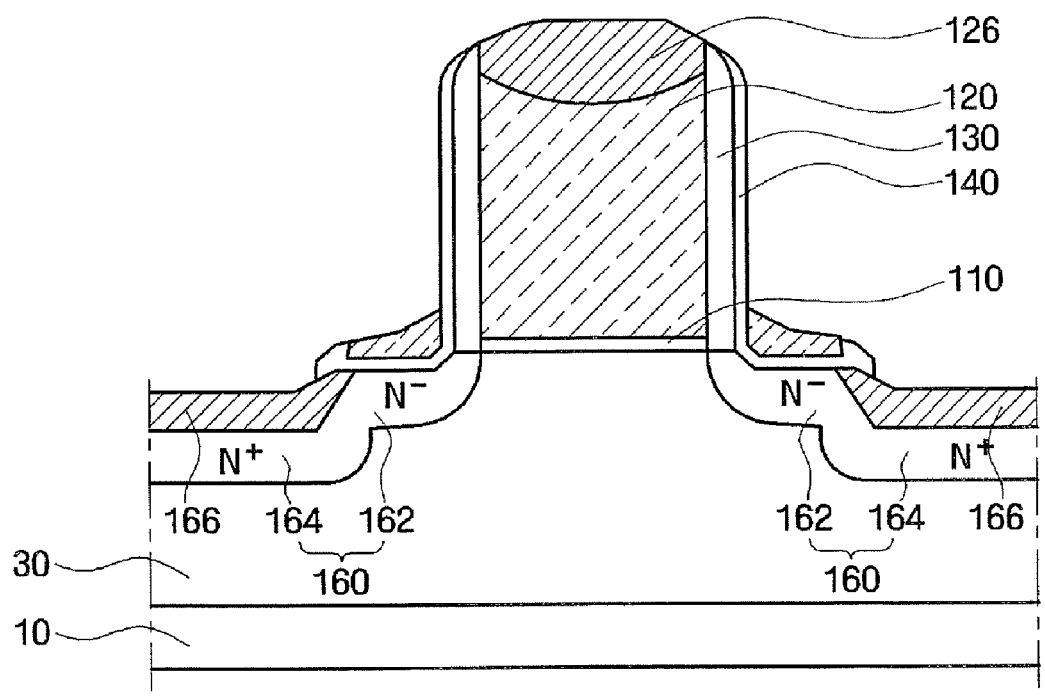
Figure 2C:
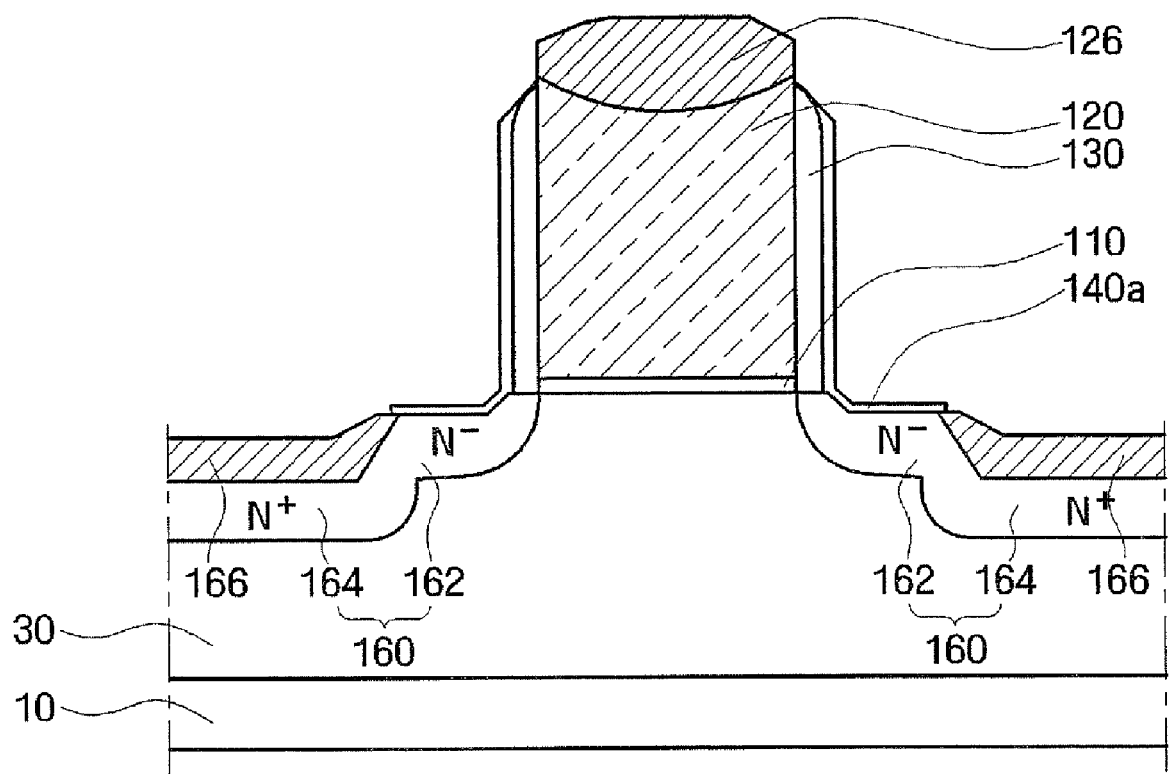

FIGS. 2A through 2C are cross-sectional views for explaining a method of fabricating a semiconductor integrated circuit device according to a second embodiment of the present invention. Since the process of removing a spacer nitride film according to the second embodiment of the present invention is different from that according to the first embodiment of the present invention, it will be described in detail with reference to FIGS. 2A through 2C.

Referring to FIG. 2A, a spacer nitride film 150 of an NMOS transistor is partially removed from the structure of FIG. 1E.

The spacer nitride film 150 may be removed using hydrofluoric acid in which selectivity for nitride to oxide exceeds one. Alternatively, the spacer nitride film 150 may be exposed by removing a remaining oxide film 172*a* using hydrofluoric acid in which selectivity for nitride to oxide is less than one, and then the spacer nitride film 150 may be removed using hydrofluoric acid in which selectivity for nitride to oxide exceeds one.

Referring to FIG. 2B, a silicide film 126 and/or 166 is formed in a second impurity region 164 and/or on the gate 120, as illustrated.

Referring to FIG. 2C, the remaining spacer nitride film 150 shown in FIG. 2B is etched using reactive ion etching (RIE).

Figure 3A:
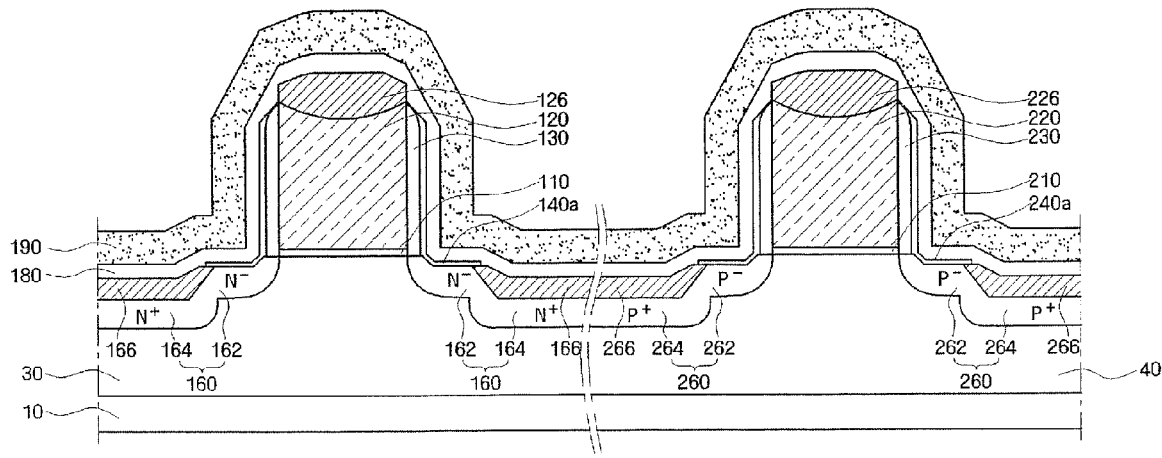
FIGS. 3A and 3B are cross-sectional views of intermediate structures that illustrate methods of fabricating semiconductor integrated circuit devices according to additional embodiments of the present invention.
Figure 3B:
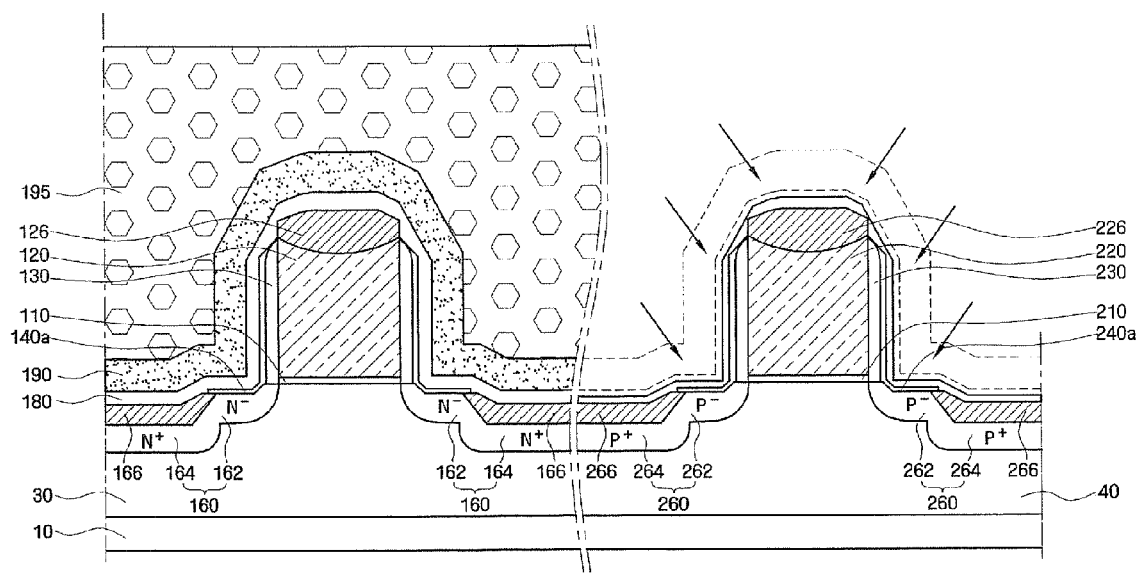

FIGS. 3A and 3B are cross-sectional views for explaining a method of fabricating a semiconductor integrated circuit device according to a third embodiment of the present invention. Referring to FIG. 3A, an NMOS transistor and a PMOS transistor are formed on a semiconductor substrate 10. The NMOS transistor is formed using the method described above with reference to FIGS. 1A through 1H, and the PMOS transistor is formed using a method similar to the method of fabricating the NMOS transistor. Elements of the PMOS transistor, which have not been descried above, include an N well 40, a gate 220, a spacer oxide film 230, an adhesive oxide film 240*a*, a source/drain region 260, a first impurity region 262, a second impurity region 264, and a silicide film 226 and 266.

An etch-stopping film 180 and a stress-inducing film 190 such as those illustrated in FIG. 1H are formed on the NMOS and PMOS transistors. When the stress film 190 is a nitride film, an N—H/Si—H bonding ratio determines whether the stress film 190 applies tensile stress or compressive stress. The stress film 190 having tensile stress enhances operating characteristics of the NMOS transistor, and the stress film 190 having compressive stress enhances operating characteristics of the PMOS transistor. Conversely, if a stress film having tensile stress is formed on the PMOS transistor, the operating characteristics of the PMOS transistor deteriorates. Therefore, when the stress film 190 has tensile stress, it must be removed from the PMOS transistor.

Referring to FIG. 3B, the stress film 190 formed on the PMOS transistor is removed. Specifically, a photoresist pattern 195 masking the NMOS transistor is formed on the semiconductor substrate 10, and the stress film 190 formed on the PMOS transistor is removed using hydrofluoric acid in which selectivity for nitride to oxide exceeds one. As described above, hydrofluoric acid in which selectivity for nitride to oxide exceeds one may be at a temperature of approximately 65° C. or higher and lower than approximately 85° C. and may be diluted at approximately 1000:1 to 2500:1, more specifically, at approximately 1500:1 to 2000:1.

Figure 4A:
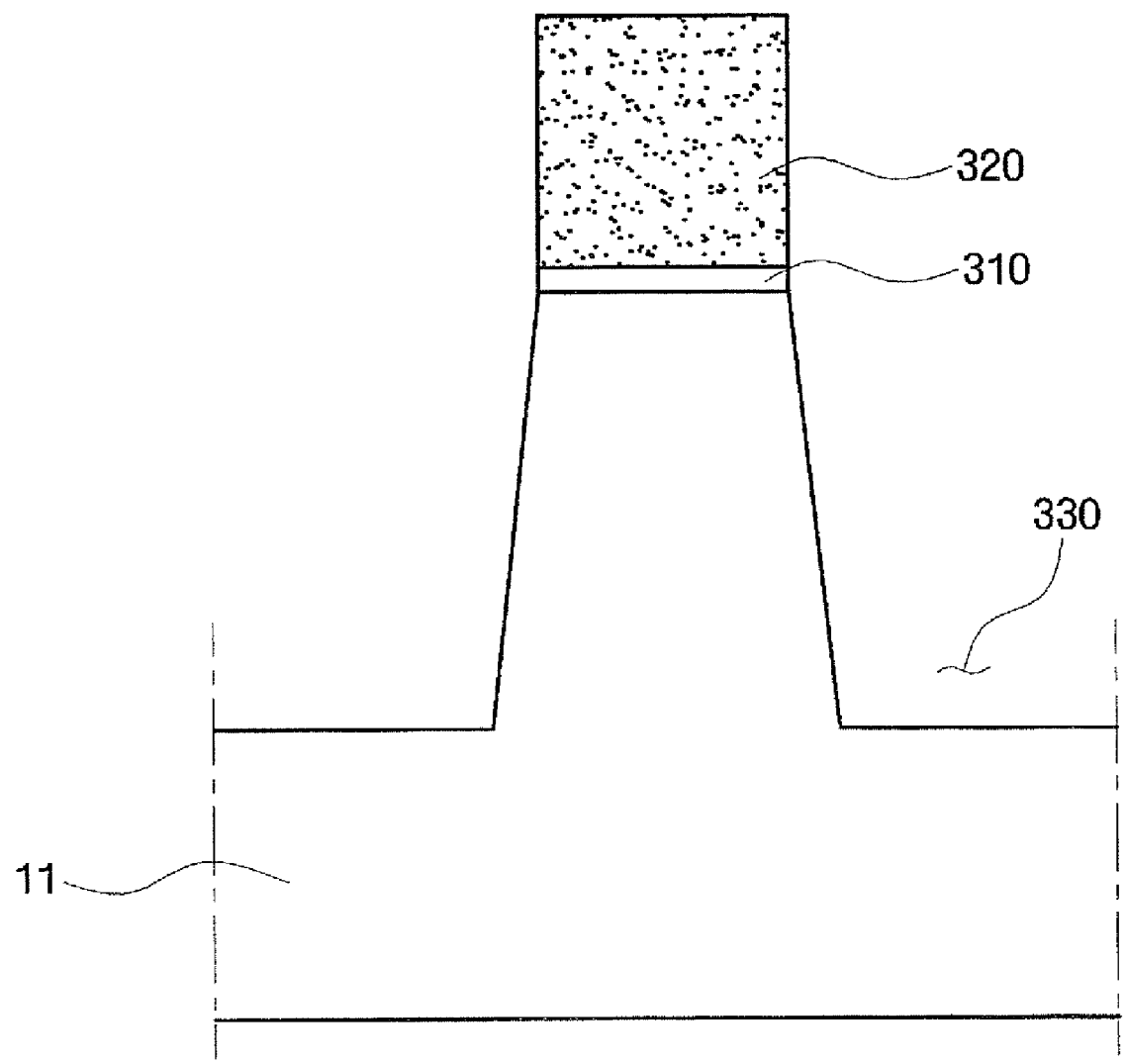

FIGS. 4A through 4F are cross-sectional views for explaining a method of fabricating a semiconductor integrated circuit device according to a fourth embodiment of the present invention. Referring to FIG. 4A, a trench 330 is formed in a semiconductor substrate 11. Specifically, a pad oxide film 310 and a pad nitride film 320, which is used to define the trench 330, are sequentially formed on the semiconductor substrate 11. The pad oxide film 310 may be grown by oxidation to a thickness of approximately 40 to 150 Å, and the pad nitride film 320 may be stacked on the pad oxide film 310 by LPCVD to a thickness of approximately 600 to 1500 Å. The pad oxide film 310 relieves stress between the semiconductor substrate 11 and the pad nitride film 320. The pad nitride film 320 is used as an etch mask when the trench 330 is formed and serves as an etch-stopping film in a subsequent chemical mechanical planarization (CMP) process. The trench 330 may be formed to a shallow depth of approximately 3000 Å using the pad nitride film 320 as an etch mask. The trench 330 may be formed using, for example, RIE.

Figure 4B:
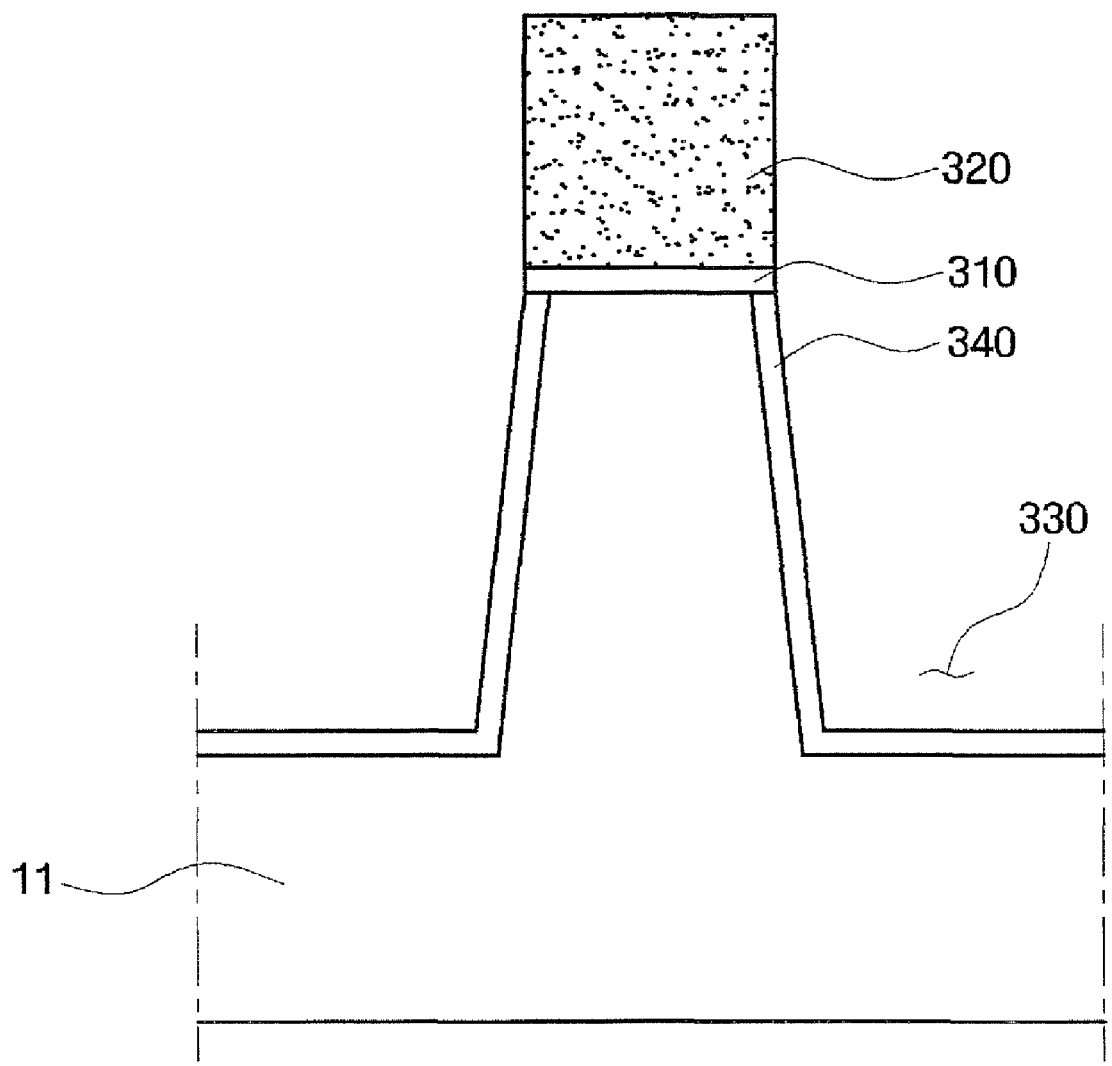

Referring to FIG. 4B, a liner oxide film 340 is conformally formed along the trench 330. More specifically, on inner sidewalls of the trench 330, the liner oxide film 340 is grown by oxidation to a thickness of approximately 100 to 400 C at a temperature of approximately 800 to 900° C. The liner oxide film 340 repairs the damaged silicon lattice, which results from the etching process, on the inner sidewalls of the trench 330.

Referring to FIG. 4C, a liner nitride film 350 is conformally formed along the liner oxide film 340 and the pad nitride film 320 and along the trench 330. Specifically, the liner oxide film 350 may be formed by LPCVD to a thickness of approximately 70 to 300 Å.

Figure 4D:
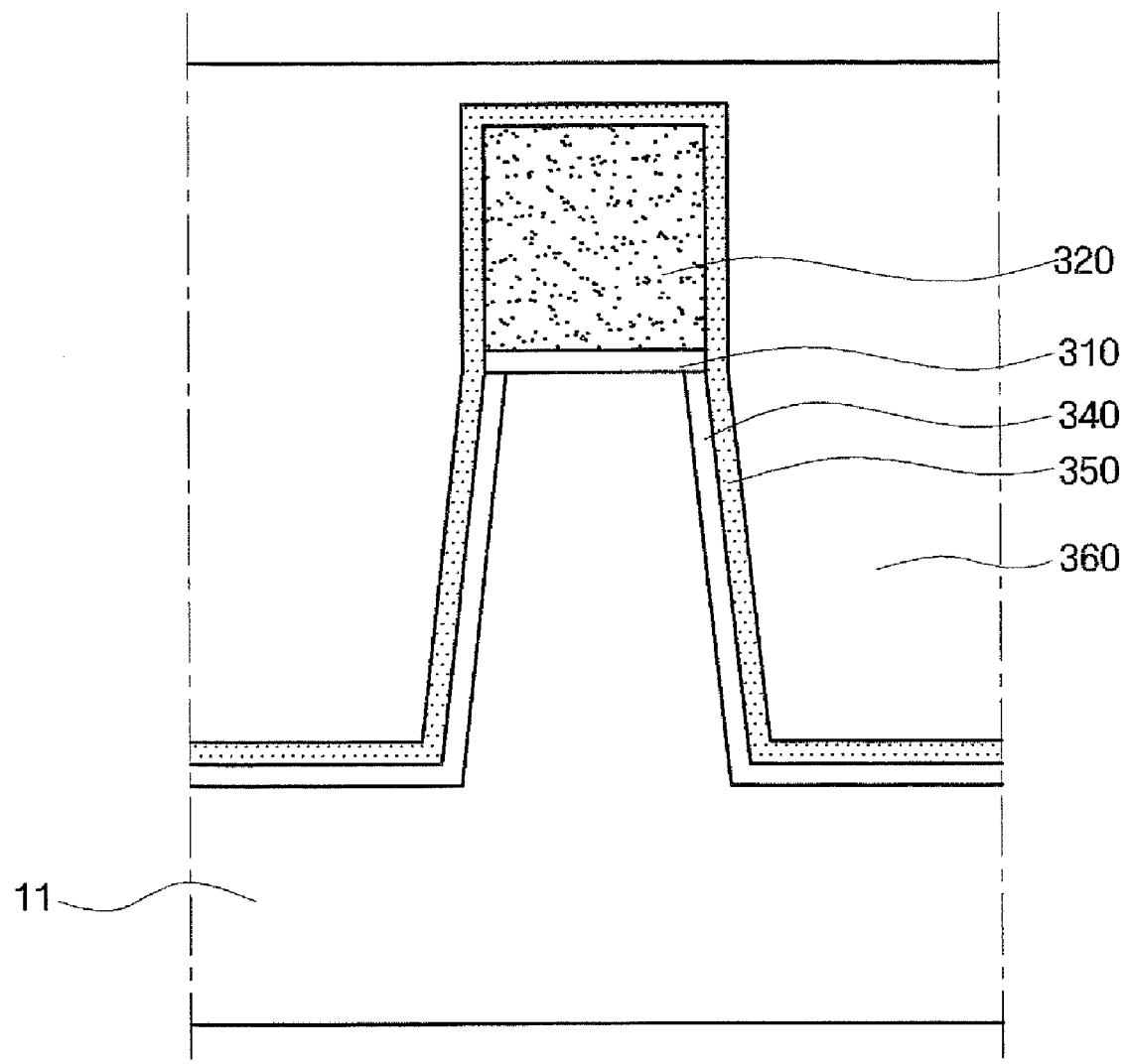

Referring to FIG. 4D, a buried oxide film 360 is formed on the liner oxide film 350 so that the trench 330 can be buried. Specifically, an oxide film is formed on the semiconductor substrate 11 to a thickness sufficient to bury the trench 330. Although there may be some differences according to design rules of a semiconductor element, the oxide film may be formed by $O_3$-tetra ortho silicate glass (TEOS), atmospheric pressure chemical vapor deposition (APCVD) or plasma enhanced chemical vapor deposition (PECVD), or high concentration plasma chemical vapor deposition (HDPCVD). Next, the oxide film is planarized by CMP. Selectively, a thermal process may be performed.

Figure 4E:
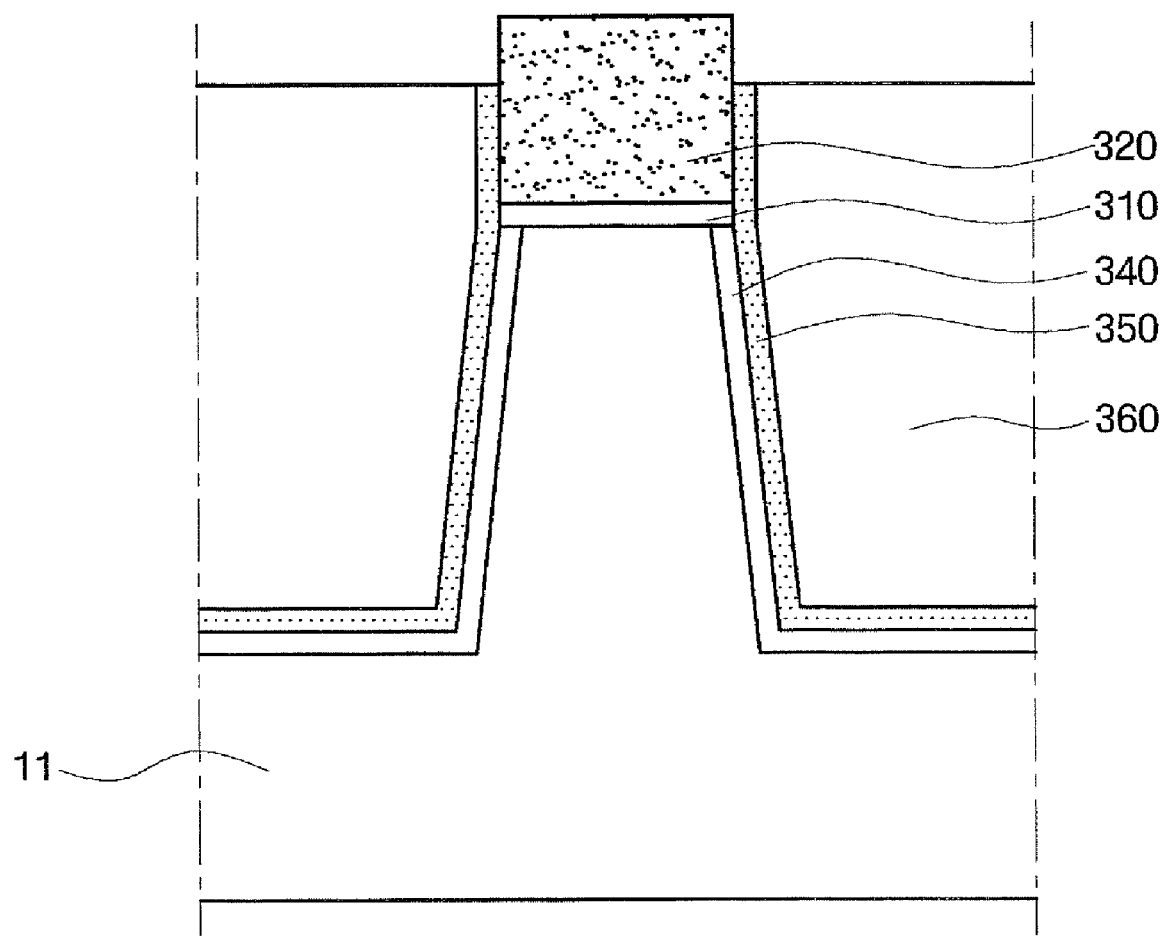

Referring to FIG. 4E, the buried oxide film 360 and the liner nitride film 350 are partially etched so that a top surface of the pad nitride film 320 can be exposed. In particular, in the fourth embodiment of the present invention, the process of lowering the height of the buried oxide film 360 by partially removing the buried oxide film 360 and the process of partially etching the liner nitride film 350 are simultaneously performed.

Specifically, the buried oxide film 360 and the liner nitride film 350 are partially etched using hydrofluoric acid in which selectivity for nitride to oxide is approximately 0.7 to 1.4. The selectivity for nitride to oxide may be, for example, approximately one. In addition, the temperature of hydrofluoric acid may be between approximately 65° C. and approximately 85° C., and the concentration of hydrofluoric acid may be approximately 300:1.

Figure 4F:
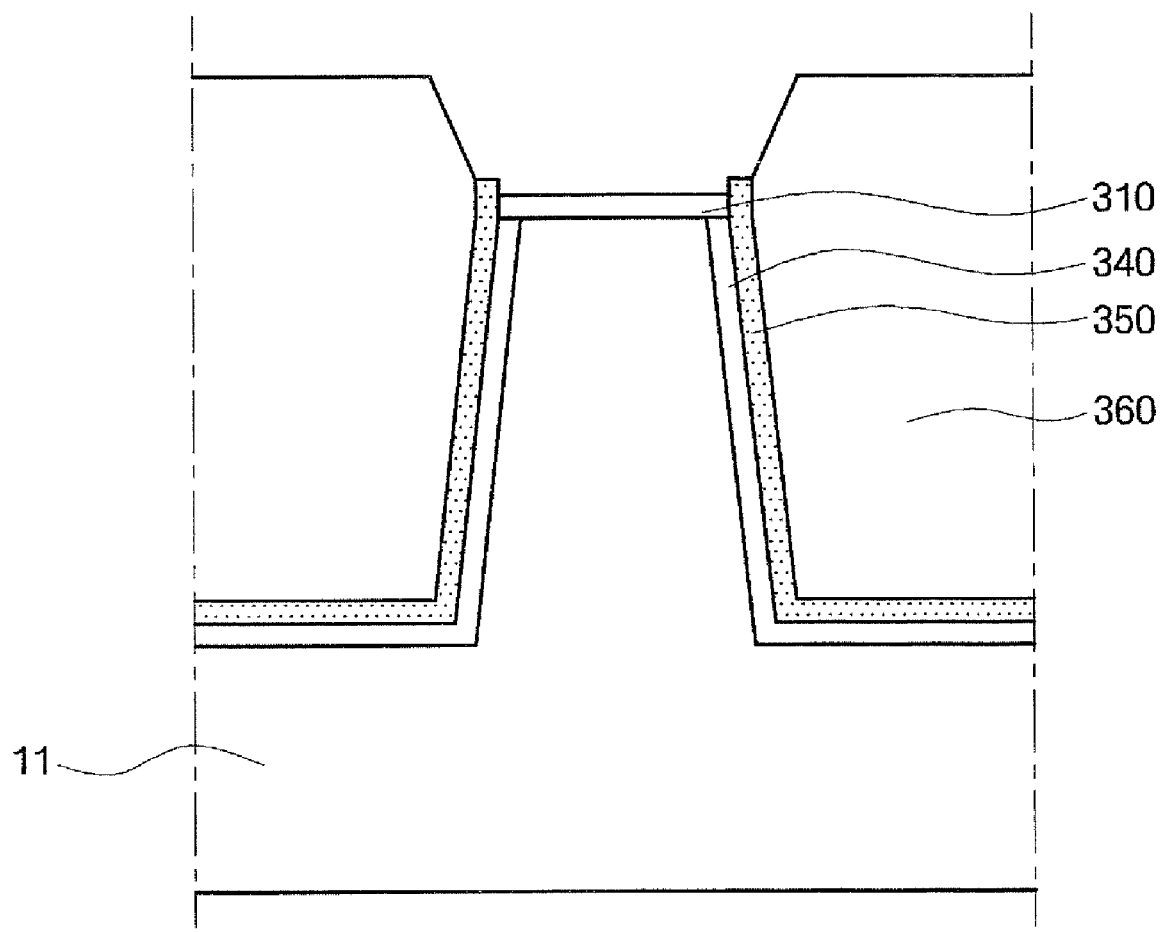

Referring to FIG. 4F, the pad nitride film 320 is removed to expose the pad oxide film 310. The pad nitride film 320 may be removed using phosphoric acid.

Alternatively, the pad nitride film 320 may be removed using hydrofluoric acid in which selectivity for nitride to oxide is approximately 10 to 50. In this case, the temperature of hydrofluoric acid may be approximately 65° C. or higher and lower than approximately 85° C. In addition, hydrofluoric acid may be diluted at approximately 1000:1 to 2500:1, more specifically, at approximately 1500:1 to 2000:1, in order to sufficiently increase the selectivity for nitride to oxide.

Figure 5:
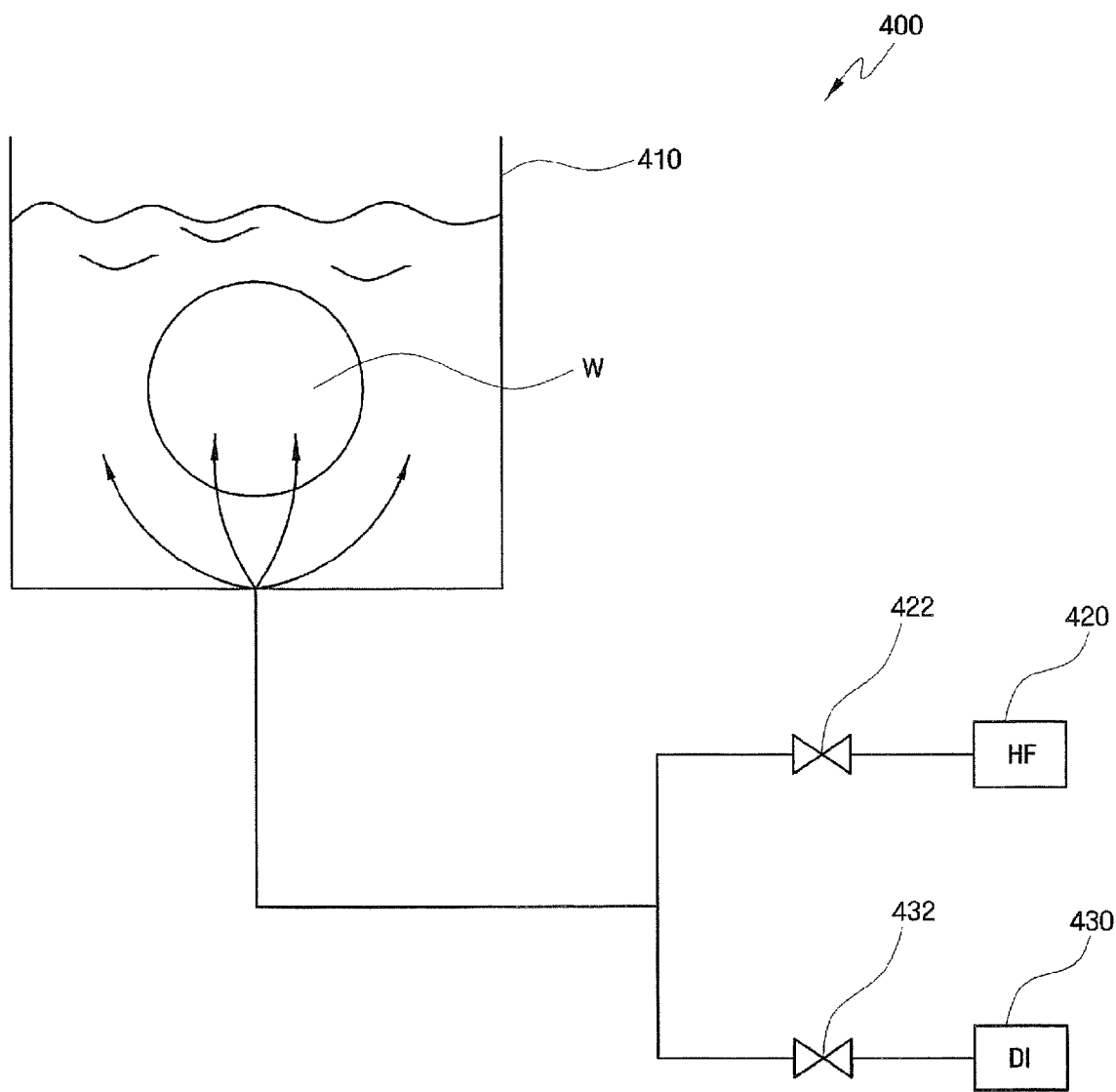
FIG. 5 is a schematic for explaining a method of fabricating semiconductor integrated circuit devices according to additional embodiments of the present invention.

FIG. 5 is a diagram for explaining a method of fabricating a semiconductor integrated circuit device according to a fifth embodiment of the present invention. The fifth embodiment of the present invention is different from the fourth embodiment in that the process of partially removing a buried oxide film and a liner nitride film (see FIG. 4E) and the process of removing a pad oxide film (see FIG. 4F) are consecutively performed. Referring to FIG. 5, a semiconductor fabrication facility 400 includes a bath 410, a fluorine storage unit 420, a valve 422, a deionized water (DI) storage unit 430, and another valve 432.

As illustrated, a semiconductor substrate W is placed in the bath 410. The semiconductor substrate W includes a pad oxide film and a pad nitride film sequentially formed thereon, a trench formed in the semiconductor substrate W using the pad oxide film and the pad nitride film as etch masks, a liner oxide film conformally formed along the trench, a liner nitride film conformally formed along the liner oxide film and the pad nitride film, and a buried oxide film formed on the liner oxide film to bury the trench.

Next, part of the buried oxide film, part of the liner nitride film, and the pad nitride film are etched while varying the temperature and/or concentration of hydrofluoric acid in the bath 410. That is, hydrofluoric acid is used to partially remove the buried oxide film and the liner nitride film in order to expose a top surface of the pad nitride film, and the concentration of hydrofluoric acid is adjusted using the valves 422 and 432 such that selectivity for nitride to oxide is approximately 0.7 to 1.4. The concentration of hydrofluoric acid may be, for example, approximately 300:1.

The concentration of hydrofluoric acid used when removing the pad nitride film is adjusted using the valves 422 and 432 such that selectivity for nitride to oxide is approximately 10 to 50. For example, the concentration of hydrofluoric acid may be approximately 1000:1 to 2500:1, more specifically, approximately 1500:1 to 2000:1.

The above concentrations of hydrofluoric acid are mere examples. However, the concentration of hydrofluoric acid used when removing the pad nitride film may be adjusted to be lower than that of hydrofluoric acid used when partially removing the buried oxide film and the liner nitride film.

In the fifth embodiment of the present invention, the temperature of hydrofluoric acid used when removing the pad nitride film is equal to that of hydrofluoric acid used when partially removing the buried oxide film and the liner nitride film. However, the present invention is not limited thereto. That is, when the buried oxide film and the liner nitride film are partially removed, the temperature of hydrofluoric acid may be raised in order to increase selectivity for nitride to oxide.

In addition, in the fifth embodiment of the present invention, the concentration of hydrofluoric acid is adjusted twice (that is, once in the process of partially removing the buried oxide film and the liner nitride film and once in the process of removing the pad nitride film). However, the present invention is not limited thereto. That is, after the semiconductor substrate W is placed in the bath 410, the temperature and/or concentration of hydrofluoric acid may be adjusted three or more times and, accordingly, the selectivity for nitride to oxide of hydrofluoric acid may be adjusted three or more times. In so doing, part of the buried oxide film, part of the liner nitride film, and the pad nitride film can be removed.

While the present invention has been particularly shown and described with reference to exemplary embodiments thereof, it will be understood by those of ordinary skill in the art that various changes in form and detail may be made therein without departing from the spirit and scope of the present invention as defined by the following claims. The exemplary embodiments should be considered in descriptive sense only and not for purposes of limitation.

What is claimed is:

1. A method of forming an integrated circuit device, comprising:
    forming a field effect transistor on a semiconductor substrate, said forming a field effect transistor comprising:

forming a gate electrode on the semiconductor substrate;

forming oxide spacers on opposing sidewalls of the gate electrode;

forming an adhesive oxide film on the oxide spacers, wherein the adhesive oxide film directly contacts a surface of the semiconductor substrate;

forming sacrificial nitride spacers on the adhesive oxide film, said sacrificial nitride spacers extending opposite the opposing sidewalls of the gate electrode; and forming source/drain regions, which are self-aligned to the sacrificial nitride spacers, in the semiconductor substrate;

forming a blocking oxide film on the sacrificial nitride spacers; and selectively etching the blocking oxide film using a diluted hydrofluoric acid solution having a nitride-to-oxide etching selectivity less than one;

selectively removing the sacrificial nitride spacers using a diluted hydrofluoric acid solution having a nitride-to-oxide etching selectivity in excess of one, to thereby expose the adhesive oxide film;

forming a stress-inducing electrically insulating layer that is configured to induce a net tensile or compressive stress in a channel region of the field effect transistor, on the opposing sidewalls of the gate electrode; and selectively removing a portion of the stress-inducing electrically insulating layer using a diluted hydrofluoric acid solution having a nitride-to-oxide etching selectivity in excess of one.

2. The method of claim 1, wherein a temperature of the diluted hydrofluoric acid solution for selectively removing the sacrificial nitride spacers is in a range between about 65° C. and about 85° C.

3. The method of claim 2, wherein the diluted hydrofluoric acid solution for selectively removing the sacrificial nitride spacers has a water-to-HF volume ratio in a range from about 1000:1 to about 2500:1.

4. The method of claim 2, wherein the diluted hydrofluoric acid solution for selectively removing the sacrificial nitride spacers has a water-to-HF volume ratio in a range from about 1500:1 to about 2000:1.

5. The method of claim 1, wherein said selectively removing comprises selectively removing the sacrificial nitride spacers using a diluted hydrofluoric acid solution having a nitride-to-oxide etching selectivity in a range from about 10 to about 50.

6. The method of claim 1, wherein forming a stress-inducing electrically insulating layer is preceded by forming metal silicide layers on the source/drain regions, using the adhesive oxide film as a silicide mask.

7. A method of fabricating a semiconductor integrated circuit device, the method comprising:

providing a semiconductor element comprising a semiconductor substrate, a gate which is formed on the semiconductor substrate, a spacer oxide film and a spacer nitride film which are sequentially formed on both sidewalls of the gate, an adhesive oxide film which is formed between the semiconductor substrate and the spacer nitride film and between the spacer oxide film and the spacer nitride film, a first impurity region which is aligned with the spacer oxide film, and a second impurity region which is aligned with the spacer nitride film;

sequentially forming a blocking oxide film and a blocking nitride film on the semiconductor element;

etching the blocking nitride film using hydrofluoric acid in which selectivity for nitride to oxide exceeds one;

after etching the blocking nitride film, at least partially wet-etching the spacer nitride film using hydrofluoric acid in which selectivity for nitride to oxide exceeds one;

forming a silicide film in the second impurity region; and sequentially forming an etch-stopping film and a stress film on the semiconductor substrate and the gate;

wherein a portion of the adhesive oxide film extending between the semiconductor substrate and the spacer nitride film directly contacts a surface of the semiconductor substrate.

8. The method of claim 7, wherein the providing of the semiconductor element comprises:

forming the gate on the semiconductor substrate;

forming the spacer oxide film on the sidewalls of the gate;

forming the first impurity region aligned with the spacer oxide film;

forming the spacer nitride film on the spacer oxide film and forming the adhesive oxide film between the semiconductor substrate and the spacer nitride film and between the spacer oxide film and the spacer nitride film; and forming the second impurity region aligned with the spacer nitride film.

9. The method of claim 7, wherein the stress film is a nitride film, and the etch-stopping film is an oxide film.

10. The method of claim 7, further comprising removing the stress film using hydrofluoric acid in which selectivity for nitride to oxide exceeds one.

* * * * *